(12) United States Patent
Martell et al.

(10) Patent No.: US 11,060,777 B2
(45) Date of Patent: Jul. 13, 2021

(54) COMPRESSOR CONTROL CIRCUIT

(71) Applicant: Phillips & Temro Industries, Inc., Eden Prairie, MN (US)

(72) Inventors: Jeffrey James Martell, Bloomington, MN (US); Eric Graham Ruggles, Bloomington, MN (US); John David Sweazey, Eden Prairie, MN (US)

(73) Assignee: Phillips & Temro Industries, Inc., Eden Prairie, MN (US)

( * ) Notice: Subject to any disclaimer, the term of this patent is extended or adjusted under 35 U.S.C. 154(b) by 126 days.

(21) Appl. No.: 16/257,894

(22) Filed: Jan. 25, 2019

(65) Prior Publication Data
US 2019/0234662 A1    Aug. 1, 2019

Related U.S. Application Data

(60) Provisional application No. 62/623,146, filed on Jan. 29, 2018.

(51) Int. Cl.
| | |
|---|---|
| *F25B 49/02* | (2006.01) |
| *B60H 1/32* | (2006.01) |
| *G01R 19/165* | (2006.01) |
| *B60H 1/00* | (2006.01) |
| *F25B 27/00* | (2006.01) |

(52) U.S. Cl.
CPC ....... *F25B 49/022* (2013.01); *B60H 1/00778* (2013.01); *B60H 1/322* (2013.01); *B60H 1/323* (2013.01); *B60H 1/3208* (2013.01); *F25B 49/025* (2013.01); *G01R 19/16571* (2013.01); *G01R 19/16576* (2013.01); *F25B 27/00* (2013.01); *F25B 2600/0253* (2013.01); *F25B 2700/2104* (2013.01)

(58) Field of Classification Search
CPC ...... B60H 1/323; F25B 49/022; F25B 49/025; G01R 19/16571; G01R 19/16576
See application file for complete search history.

(56) References Cited

U.S. PATENT DOCUMENTS

| | | | | |
|---|---|---|---|---|
| 4,389,855 | A * | 6/1983 | Ueda | B60H 1/00207 62/200 |
| 4,404,462 | A * | 9/1983 | Murray | C02F 1/5209 219/497 |
| 5,125,067 | A * | 6/1992 | Erdman | H02P 6/085 388/811 |
| 6,269,650 | B1 * | 8/2001 | Shaw | F24F 11/83 62/176.6 |
| 2008/0115512 | A1 * | 5/2008 | Rizzo | B60H 1/00428 62/134 |

(Continued)

*Primary Examiner* — Henry T Crenshaw
(74) *Attorney, Agent, or Firm* — Foley & Lardner LLP

(57) ABSTRACT

The auxiliary AC system includes a temperature measurement device configured to generate a variable output based on an air temperature in an environment proximate to the AC system and a compressor control circuit communicably coupled to a variable speed motor. The compressor control circuit is configured to receive the variable output from the temperature measurement device, determine that the output indicates a change in the air temperature, and generate a control signal for the variable speed motor, the control signal including a current having a magnitude depending on the extent of the change to vary a rate at which a compressor pressurizes a refrigerant vapor.

15 Claims, 7 Drawing Sheets

(56) References Cited

U.S. PATENT DOCUMENTS

2012/0067070 A1* 3/2012 Albertson ............. F25B 49/022
62/126
2014/0230470 A1* 8/2014 Cook ................... B60H 1/3222
62/118

* cited by examiner

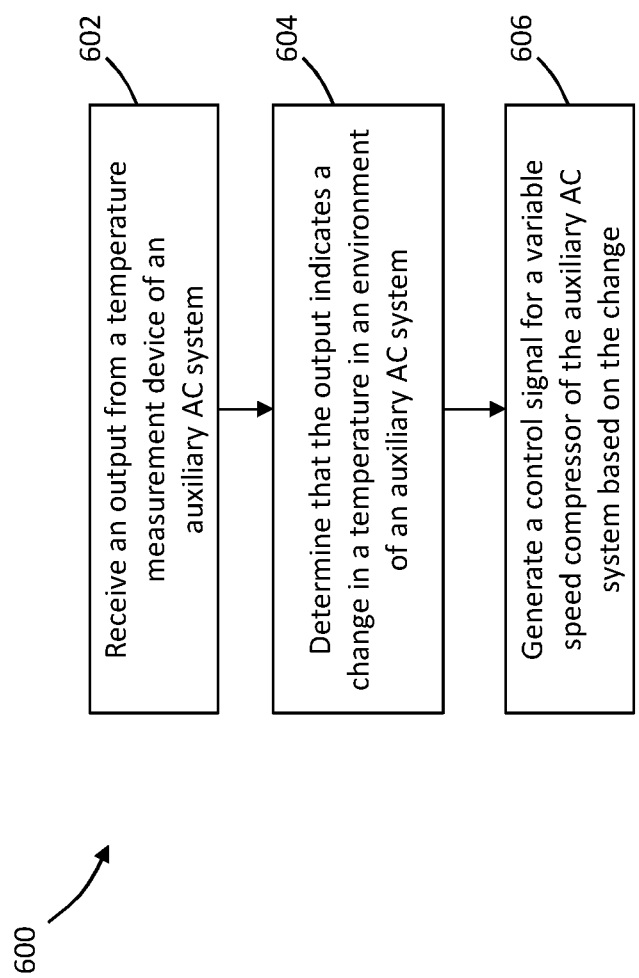

COMPRESSOR CONTROL CIRCUIT

CROSS-REFERENCE TO RELATED APPLICATIONS

This application claims the benefit of and priority to U.S. Provisional Application No. 62/623,146, filed on Jan. 29, 2018, the entire disclosure of which is hereby incorporated by reference herein.

BACKGROUND

The following description is provided to assist the understanding of the reader. None of the information provided of references cited are admitted to be prior art.

Vehicles may include a battery that powers various accessory components of a vehicle even if the vehicle's engine is not running. If the vehicle's engine is not running, the duration that the accessary components may draw on the battery is limited by the battery's capacity and the accessory components' efficiency.

SUMMARY

One embodiment of the invention relates to an auxiliary air conditioning (AC) system for a vehicle. The auxiliary AC system includes an evaporator coil, a condenser coil coupled to the evaporator coil via a refrigerant conduit, and a compressor disposed at the refrigerant conduit between the evaporator coil and the condenser coil. The compressor includes a variable speed motor configured to pressurize refrigerant vapor received from the evaporator coil via the refrigerant conduit. The auxiliary AC system also includes a temperature measurement device configured to generate a variable output based on an air temperature in an environment proximate to the air conditioning system and a compressor control circuit communicably coupled to the variable speed motor. The compressor control circuit is configured to receive the variable output from the temperature measurement device, determine that the output indicates a change in the air temperature, and generate a control signal for the variable speed motor, the control signal including a current having a magnitude depending on the extent of the change to vary a rate at which the compressor pressurizes the refrigerant vapor.

Another embodiment relates to a vehicle. The vehicle includes a main battery bank, an auxiliary battery bank, and an auxiliary air conditioning (AC) system connected to the auxiliary battery bank to receive a supply voltage therefrom. The auxiliary AC system includes an evaporator coil and a compressor coupled to the evaporator coil via a refrigerant conduit. The compressor includes a variable speed motor configured to pressurize refrigerant vapor received from the evaporator coil via the refrigerant conduit. The auxiliary AC system also includes a temperature sensor connected to the auxiliary battery bank to receive the supply voltage via a first terminal thereof to generate a variable voltage at a second terminal thereof based on an air temperature. The auxiliary AC system also includes a compressor control circuit communicably coupled to the variable speed motor, the compressor control circuit configured to generate a control signal for the variable speed motor based on a difference between the air temperature and a previous air temperature measured via the temperature sensor.

Another embodiment relates to an analog control circuit for an auxiliary air conditioning system. The analog control circuit includes a temperature sensor including a first terminal connected to a power supply and a second terminal connected to an input line. The analog control circuit also includes an operational amplifier including first input coupled to the input line and a second input coupled to an output of the operational amplifier. The output is also coupled to an output line including a first resistor, a second resistor, and a node disposed between the first and second resistors. The analog control circuit also includes a first voltage regulator parallel to the output line, the first voltage regulator including a reference input connected to the output line via the node so as to produce a constant voltage output having a current depending on a variable voltage at the output, wherein the output line is connected to a variable speed motor of a compressor of the auxiliary AC system such that the motor operates at a speed based on the current.

BRIEF DESCRIPTION OF THE DRAWINGS

FIG. 6 is a flow diagram of a method of controlling an auxiliary AC system for a vehicle, according to an example embodiment.

DETAILED DESCRIPTION

Reference will now be made to various embodiments, one or more examples of which are illustrated in the figures. The embodiments are provided by way of explanation, and not meant to be limited. For example, features illustrated or described as part of one embodiment may be used with another embodiment to yield still a further embodiment. It is intended that the present application encompass these and other modifications and variations as come within the scope and spirit of the present disclosure.

Referring generally to the figures, described herein is an auxiliary air conditioning ("AC") system for a vehicle. The auxiliary AC system may include, in addition to other components, an evaporator coil, a condenser coil, and a compressor. The compressor may include a variable speed motor. In various embodiments, various components of the auxiliary AC system are powered at least in part by an auxiliary battery bank of the vehicle, apart from the vehicle's main battery. For example, the auxiliary AC system may be used when an engine of the vehicle is turned off by a start-stop system of the vehicle. As such, the auxiliary AC system may only cool the interior of the vehicle for only a limited amount of time (e.g., dependent on a charging level of the auxiliary battery bank). Thus, to maximize a run duration of the auxiliary AC system, the power utilization of the auxiliary AC system is minimized. In this regard, the auxiliary AC system includes a control circuit configured to drive an air temperature proximate to the auxiliary AC system to a temperature setpoint while consuming a low amount of power. The control circuit may include an analog control circuit that varies an output voltage provided to the variable speed motor based on variations in the air temperature. Thus, the control circuit described herein avoids the high power requirements of microprocessors but still provides real-time control to maintain a setpoint temperature. In addition, the analog nature of the control circuit provides increased reliability and simplicity as compared to microprocessor-type controllers. Various parameters of electrical signals (e.g., voltage, current, etc.) are discussed below with respect to the various FIGS. 1-6. The concepts described herein should not be limited to the specific parameters as discussed in the examples below.

Figure 1:
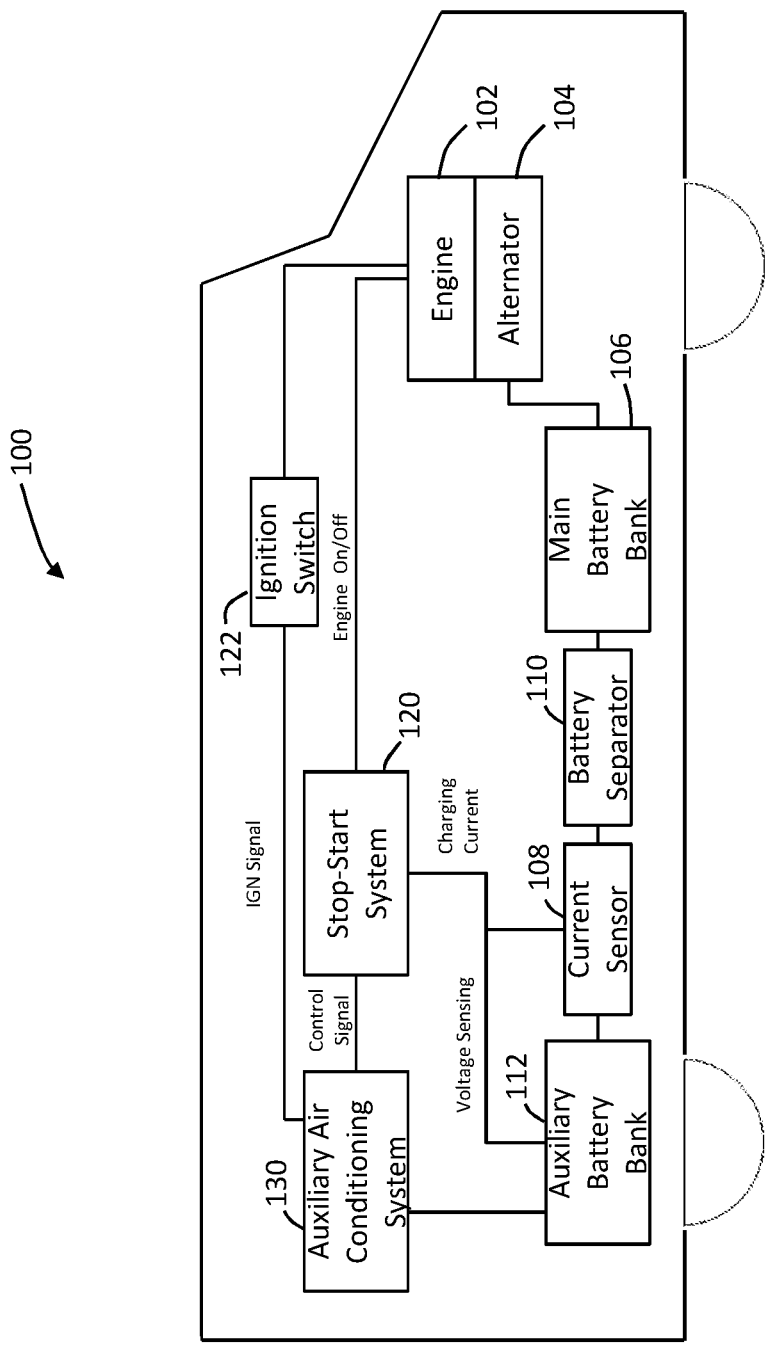
FIG. 1 is a block diagram of a vehicle including an auxiliary air conditioning ("AC") system and a start-stop system, according to an example embodiment.

Referring now to FIG. 1, a block diagram of a vehicle 100 including an auxiliary AC system 130 and a start-stop system 120 is shown, according to an example embodiment. In various embodiments, the vehicle 100 is any automotive vehicle. In some embodiments, the vehicle 100 is an over-the-road vehicle such as a semi-trailer truck including a tractor unit and a trailer. The tractor unit may comprise a prime mover (e.g., the engine 102) and a cab for housing the driver. The cab may include a sleeper compartment, for example, disposed rearward of a driver's seat. It should be understood that the vehicle 100 includes various additional components that have been left out for purposes of illustration.

Examples of a suitable engine 102 include, but are not limited to, an internal combustion gas-powered engine, a diesel engine, a fuel cell driven motor, an electric motor, or any other type of motor capable of providing mechanical energy. These prime movers may be used alone or in combination with one or more additional power sources (as in a hybrid vehicle) to provide mechanical energy. Engine 102 generates mechanical energy (e.g., angular momentum) from an energy source (e.g., fuel). Such mechanical energy may be coupled to a motion transfer device (e.g., a transmission), which provides the energy to various motive members (e.g., wheels via a differential) of the vehicle 100. Rotational energy generated by the engine 102 is also transferred to an alternator 104 (e.g., via a belt coupled to a crankshaft of the engine 102) for conversion to electrical energy used to power various components of the vehicle 100. As shown, electrical energy produced via the alternator 104 is used to charge a main battery bank 106 of the vehicle 100. During operation of the vehicle 100, current from the main battery bank 106 serves as a power source for various subsystems (e.g., a main AC system, dashboard components, lighting systems, etc.) of the vehicle 100.

Vehicle 100 further includes an ignition switch 122 operable to complete various circuits in a control system to power on various subsystems of the vehicle 100. For example, upon closure of the ignition switch 122 (e.g., upon a driver turning a key), electrical current from the main battery bank 106 may activate a starter solenoid configured to initiate cycling of engine 102. Closure of the ignition switch 122 may complete many other circuits in the control system to power on additional subsystems (e.g., radio, lighting, etc.) of the vehicle 100.

Vehicle 100 also includes a start-stop system 120. The start-stop system 120 may include a microcontroller configured to automatically stop operation of the engine 102 responsive to certain triggers being detected. For example, in one embodiment, the start-stop system 120 stops the engine 102 when the vehicle's parking brake is engaged. The start-stop system 120 may be communicably coupled to various other vehicle sub-components (e.g., transmission, an acceleration pedal, crankshaft, wheels, etc.) for detection of various triggers for turning the engine 102 off (e.g., via breaking the starter circuit). In various embodiments, the microcontroller of the start-stop system 120 is configured to activate an electrical motor to restart the engine 102 in response to pre-conditions (e.g., the driver pressing an accelerator petal, a driver disengaging a parking break, etc.) being detected. In various embodiments, the vehicle 100 (e.g., on a dashboard thereof) includes a user-input switch (e.g., button) through which the driver may activate or deactivate the start-stop system 120.

The auxiliary AC system 130 generally includes a control circuit, a compressor, a condenser, and an evaporator. The evaporator includes a coil containing refrigerant that evaporates and absorbs heat from within the vehicle 100. A blower distributes cooled air throughout the interior of the vehicle 100. The compressor pressurizes the evaporated refrigerant gas to cause it to condense in the condenser, and a fan blows air heated as a result of the condensing outside of the vehicle 100. In some embodiments the auxiliary AC system 130 includes a separate evaporator unit, frame rail unit, and power unit. In an embodiment, the frame rail unit is installed on a frame rail of the vehicle 100 and includes the compressor and condenser, a battery separator 110, and an auxiliary battery bank 112 powering the auxiliary AC system 130. The power module may be mounted interior to the cab and include a power converter to convert power from the auxiliary battery bank 112 (e.g., from 12 V to 120 V) for utilization by the auxiliary AC system 130. The evaporator unit is installed inside of the cab of the vehicle 100 to cool air located therein. In some embodiments, the auxiliary AC system 130 includes a user-interface device (e.g., thermostat) permitting the driver or other user to control various setpoints or set heating and cooling parameters controlling operation of the auxiliary AC system 130.

In various embodiments, the compressor includes a variable speed motor configured to operate at a rate dependent on a magnitude of a parameter (e.g., a voltage magnitude, a current magnitude, etc.) of a control signal provided via the control circuit. In this regard, the control circuit includes an analog circuit coupled to a temperature measurement device configured to generate a signal dependent on an air temperature proximate to the auxiliary AC system 130 (e.g., at a return air grill of the evaporator unit). Based on the signal, the analog control circuit determines an extent and directionality of a change in the air temperature and generates a control signal to vary the speed of the variable speed motor based on the extent and directionality. For example, if the signal indicates that a temperature interior to the vehicle has increased, a magnitude of a parameter of the control signal (e.g., a voltage or a current) may increase to increase the speed of the compressor motor. As such, the control circuit produces control signals that counteract changes in the air temperature, thus maintaining the air temperature at a setpoint value.

As shown, the auxiliary battery bank 112 is connected to the main battery bank 106. In various embodiments, the anode of the main battery bank 106 is connected to the anode of the auxiliary battery bank 112 via a current sensor 108 and a battery separator 110. Cathodes of the battery banks may be directly connected to one another, such that current originating from the main battery bank 106 charges the auxiliary battery bank 112. In various embodiments, the combination of the current sensor 108 and battery separator 110 is used to determine when to charge the auxiliary battery bank 112. For example, a solenoid in the battery separator 110 may be switched on to allow current to flow between the auxiliary battery bank 112 and the main battery bank 106 to charge the auxiliary battery bank 112. Once the sensed current drops below a threshold, the solenoid may be switched off to discontinue charging. Additionally, a voltage sensor measures a voltage across various terminals of the auxiliary battery bank 112. The measured voltage may be used as a trigger for the start-stop system 120. For example, if a voltage of the auxiliary battery bank 112 drops below a second threshold value, the start-stop system 120 may start the engine 102 to charge the auxiliary battery bank 112 via the main battery bank 106.

Figure 2:
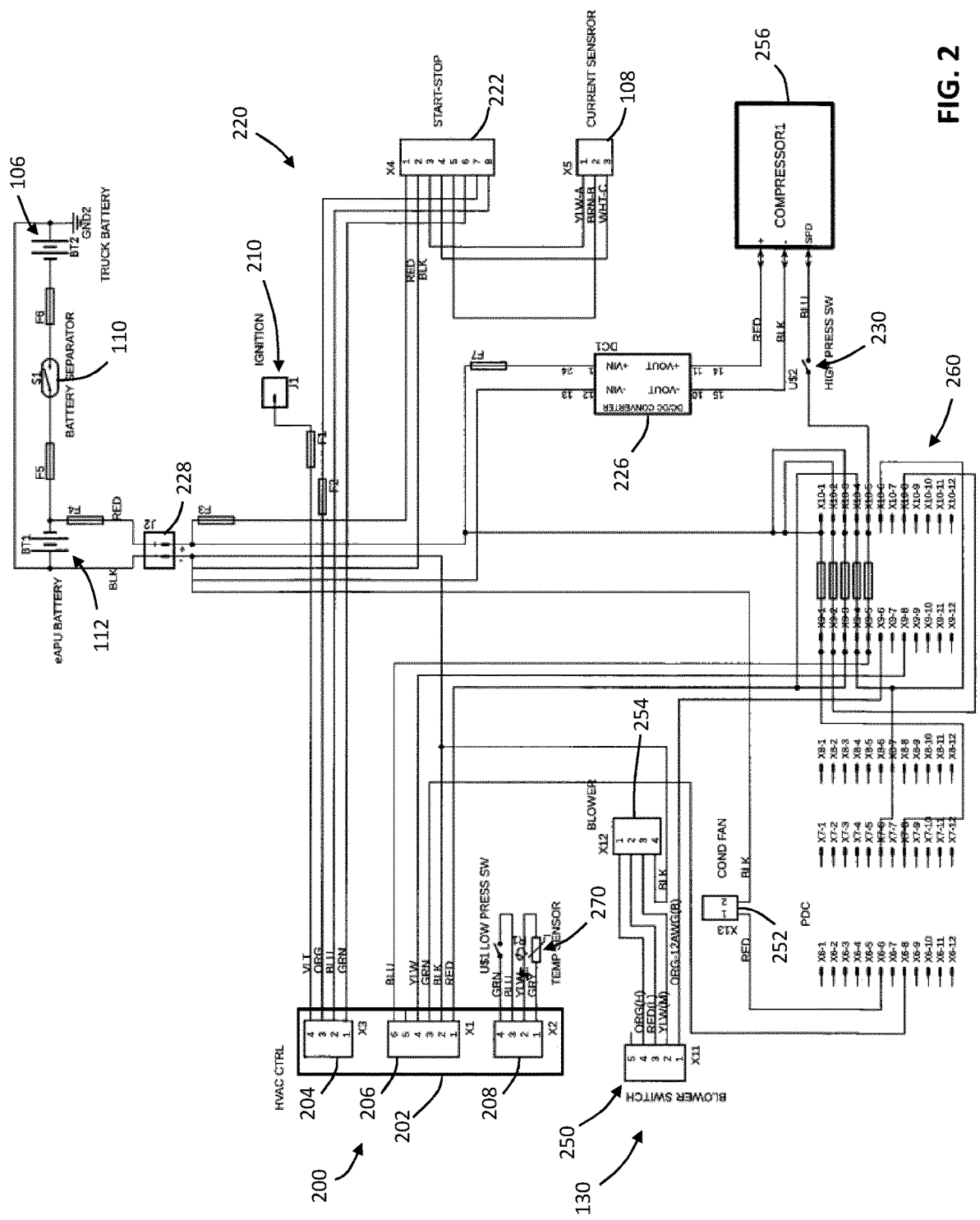
FIG. 2 is a schematic wiring diagram of a control system of the vehicle shown in FIG. 1, according to an example embodiment.

Referring now to FIG. 2, a wiring schematic diagram of a control system 200 of the vehicle 100 described with respect to FIG. 1 is shown, according to an example embodiment. As shown, the control system 200 includes a control circuit 202 controlling operation of the auxiliary AC system 130 and start-stop portion 220 controlling operation of the start-stop system 120. As shown, the auxiliary AC system 130 includes a rotary switch 250, a blower 254 associated with an evaporator, a fan 242 associated with a condenser, and a compressor 256 including a variable speed motor. The rotary switch 250 controls an operation speed of the blower 254.

The control circuit 202 includes a first connector 204 through which a number of signals are communicated. As shown, a connector jack 210 receives the IGN signal from the ignition switch 122. The connector jack 210 is connected to a first input of the first connector 204 to provide the control circuit 202 with indications of the state of the ignition switch 122. Additional inputs to the first connector are coupled to a second connector 222 of the start-stop portion 220. As shown, an ACTIVE signal is provided between inputs of the first and second connectors 204 and 222. In some embodiments, the ACTIVE signal is positively asserted by the start-stop portion 220 when the start-stop system 120 turns the engine 102 on. Additionally, the first and second connectors 204 and 222 also exchange kill signals for the auxiliary AC system 130 indicating whether the power unit should be deactivated. In some embodiments, in response to a voltage of the auxiliary battery bank 112 dropping below a threshold value (e.g., as measured by a voltage sensor) a kill signal is asserted to the connector jack 210, thereby causing the auxiliary AC system 130 to power down.

The control circuit 202 further includes a second connector 206 coupled to various components of the auxiliary AC system 130. As shown, a circuit board 260 including a plurality of wire-to-board headers is used to facilitate interconnections between the second connector 206 and the start-stop portion 220. As shown, power is provided to the control circuit 202 via the auxiliary battery bank 112 by way of associated battery studs 228 and a fuse disposed on the circuit board 260. The voltage from the auxiliary battery bank 112 is provided to the second connector 206 via HVAC_ON and COND_FAN lines coupled to the second connector 206. The HVAC_ON and COND_FAN signals are coupled to a switch 230. In various embodiments, the switch 230 is a high pressure switch configured to open upon a pressure measured in the auxiliary AC system 130 reaching a threshold value to prevent over-pressurization.

An HVAC_PWR line is coupled to the rotary switch 250 and the compressor 256 to control the operation of the auxiliary AC system 130. In some embodiments, the HVAC_PWR line includes a switch controllable by a user to manually turn the power of the auxiliary AC system 130 back on.

An additional line connected to the second connector 206 communicates a speed control signal to the compressor 256. As described herein, the control circuit 202 may include a compressor control circuit configured to vary the speed control signal based on changes in an air temperature proximate to a component of the auxiliary AC system 130. The compressor control circuit is described in greater detail with respect to FIG. 4.

The control circuit 202 also includes a third connector 208. Two inputs of the third connector 208 complete a circuit including a temperature sensor 270. The temperature sensor 270 may be any device or component capable of sensing temperature. In an embodiment, the temperature sensor 270 may be a thermistor, e.g., a semi-conductor device having an electrical resistance dependent on an air temperature proximate to the temperature sensor 270. In some embodiments, the temperature sensor 270 is a negative temperature coefficient ("NTC") thermistor having a resistance that decreases with increasing temperature. Though the temperature sensor 270 is shown as being proximate to the third connector 208 it should be understood that the temperature sensor 270 may be disposed elsewhere on various components of the auxiliary AC system 130. For example, in one embodiment, the temperature sensor 270 is disposed at a return air inlet of the evaporator (e.g., evaporator grill). In other alternative embodiments, the temperature sensor 270 is disposed apart from any components of the auxiliary AC system 130 (e.g., on an interior surface of the cab). In still other embodiments, the temperature sensor 270 may be disposed at any location that permits accurate sensing of temperature within a bunk region of the cab or other desired area of an enclosure.

While the embodiments described herein describe the utilization of a thermistor for generating a signal dependent on an air temperature, it should be understood that other temperature sensing devices may be used. For example, one embodiment may utilize a resistance temperature detector. In another embodiment, a diode-based precision temperature sensor or thermocouple may be used. In other embodiments, a digital temperature sensor may be used in conjunction with, for example, a digital-to-analog converter.

As described herein, the temperature sensor 270 provides an input voltage to the compressor control circuit that is dependent on the air temperature proximate to the temperature sensor 270. Two additional inputs of the third connector 208 are coupled to a low pressure switch configured to open and shut down the auxiliary AC system 130 if pressure inside of, for example, an evaporator coil drops below a predetermined value.

Figure 3:
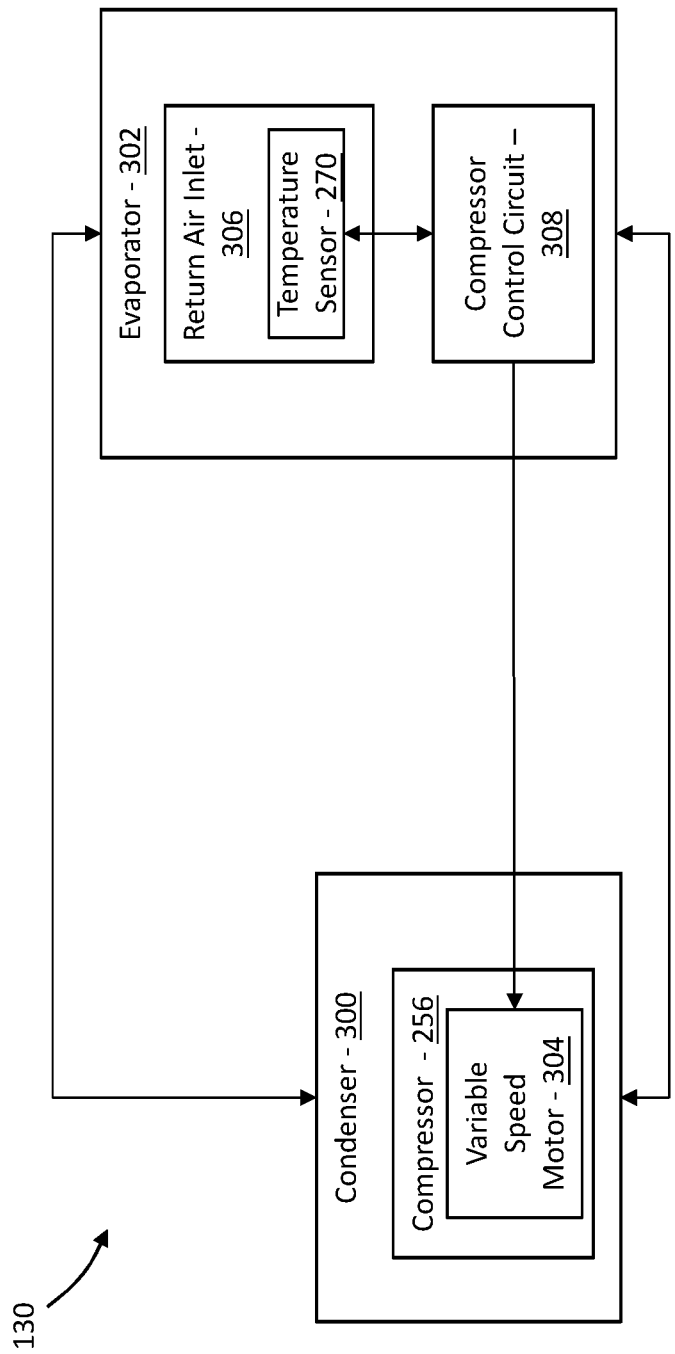
FIG. 3 is a block diagram of an auxiliary AC system for a vehicle, according to an example embodiment.

Referring now to FIG. 3, a block diagram illustrating various components of the auxiliary AC system 130 is shown, according to an example embodiment. As indicated by the double-sided arrows, a condenser 300 is coupled to an evaporator 302 (e.g., via refrigeration conduits). For example, the evaporator 302 may include a heat exchanger (e.g., coil) that absorbs heat from the interior of the cab and evaporates a refrigerant contained therein. The evaporated refrigerant is then compressed and heated via the compressor 256. As shown, the compressor 256 includes a variable speed motor 304 receiving a control signal from a compressor control circuit 308. Thus, the compressor 256 compresses the refrigerant at a rate dependent on the control signal. At the condenser 300, the heated refrigerant condenses, thereby releasing heat from the interior of the vehicle 100 to the exterior of the vehicle 100 to cool the cab.

The evaporator includes a return air inlet 306. The return air inlet 306 may receive return air as a result of a pressure differential produced by a blower (not depicted). In various embodiments, the return air inlet 306 is a conduit through which the return air is received. An evaporator return air grill may be disposed on the return air inlet 306. In various embodiments, the temperature sensor 270 is disposed on the return air grill. Such positioning of the temperature sensor 270 increases the likelihood that the temperature sensor 270 receives a consistent stream of air and generates a voltage that accurately reflects a temperature of the interior to the vehicle 100. This voltage is communicated to the compressor control circuit 308, which, as described herein, generates a control signal for the variable speed motor 304 based on the voltage.

Figure 4A:
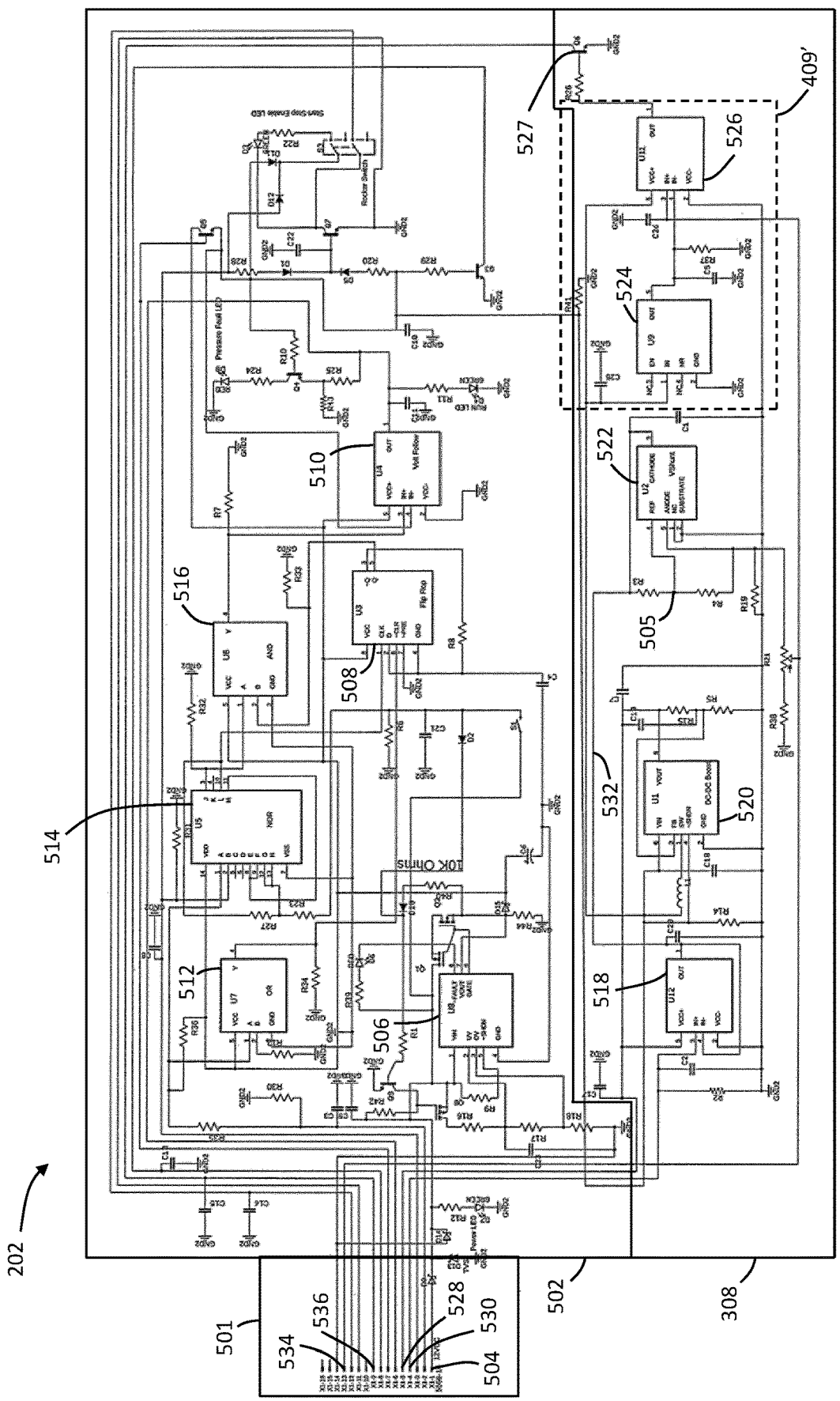
FIG. 4A is a schematic diagram of a compressor control circuit of the auxiliary AC system shown in FIG. 3, according to an example embodiment.

Referring now to FIG. 4A, a schematic diagram of a compressor control circuit 202 is shown, according to an example embodiment. As shown in FIG. 4A, the control circuit 202 is divided into two parts that share a single power supply. A first part 502 of the control circuit 202 integrates the control circuit 202 with the start-stop system 120 and ignition switch 122. A second part 308 (also referred to herein as compressor control circuit 308) of the control circuit 202 interfaces with the temperature sensor 270 and provides operational control of the compressor 256 and condenser fan 252. In various additional embodiments, additional components may be included to prevent damage associated with electrostatic discharge and to improve performance during radio frequency susceptibility testing. In some embodiments, the compressor control circuit 308 is isolated from the remainder of the control circuit 202 by a separate power source. In FIG. 4A, various components of the control circuit 202 interface with connectors 204, 206, and 208 of the control system 200 (see FIG. 2) via a terminal block 501. As shown in FIG. 4A, a supply voltage (e.g., from the auxiliary battery bank 112) is provided to the control circuit 202 by way of terminal 504.

The first part 502 of the control circuit 202 includes a power input-output component 506, a flip-flop 508, a voltage follower 510, and logic gates (OR) 512, (NOR) 514, and (AND) 516. As shown in FIG. 4A, the power input-output component 506 receives a supply voltage from the terminal 504. The power input-output component 506 provides surge capacity and reverse polarity protection to the control circuit 202. The remaining components in the first part 502 of the control circuit 202 receive supply voltage via an output (VOUT) of the power input-output component 506. The logic gates (OR) 512, (NOR) 514, and (AND) 516 are coupled to the start-stop system and provide functional control over the flip-flop 508, which acts as an on-off control for the control circuit 202. Thus, the logic gates (OR) 512, (NOR) 514, and (AND) 516 will reset the flip-flop 508 and trigger on-off conditions for the control circuit 202 depending on the state of the start-stop system 120 and ignition switch 122.

The second part 308 of the control circuit 202 includes, from left to right as shown in FIG. 4A, a first op-amp 518, a boost converter 520, a voltage regulator 522, and a comparison circuit 409. The comparison circuit 409 further includes a low dropout voltage regulator 524, and a second op-amp 526. In other embodiments, the comparison circuit 409 may include alternative and/or additional components to the low dropout voltage regulator 524 and the second op-amp 526. In the example embodiment shown in FIG. 4A, the boost converter 520 receives a supply voltage (e.g. from the auxiliary battery bank 112) through input (VIN). The output (VOUT) of the boost converter 520 is connected to terminal 528 and serves as an input to the temperature sensor 270. The boost converter 520 may be configured to output any suitable voltage depending on the specifications of the temperature sensor 270. In the example embodiment of the compressor control circuit 308 shown in FIG. 4A, the boost converter 520 provides an output voltage of 24V. The temperature sensor 270 experiences a voltage drop proportional to an air temperature proximate thereto (e.g., at the evaporator return air grill). Thus, an output voltage from the temperature sensor 270 is dependent on the air temperature. The output voltage from the temperature sensor 270 is provided via terminal 530 to a positive input (IN+) of the first op-amp 518.

As shown in FIG. 4A, a resistor R2 and a capacitor C2 extend from nodes on a line connected to the positive input of the first op-amp 518 to account for rapid variations in the output voltage provided via terminal 530. A negative input (IN−) of the first op-amp 518 is coupled to the output of the first op-amp 518. The output of the first op-amp 518 provides a varying output proportional to a difference between the output voltage from terminal 530 and a previous voltage (e.g., dependent on a previously measured voltage from the temperature sensor 270) output by the first op-amp 518. Differences between successive voltages returned via the temperature sensor 270 therefore impact the magnitude of the output of the first op-amp 518.

As shown in FIG. 4A, an output line 532 extends from the output of the first op-amp 518. The output is provided as a control signal to the variable speed motor 304 for the compressor 256 via terminal 534. The voltage (or other parameter) of the compressor speed signal is proportional to a temperature sensed by the temperature sensor 270. Thus, the control signal for the variable speed motor 304 increases or decreases depending on a change in temperature measured via the temperature sensor 270. In an embodiment, a potentiometer may be used to allow adjustment of a temperature setting of the temperature sensor 270, which would thereby shift the proportional range of the temperature sensor 270 relative to the control signal for the variable speed motor 304. Two resistors R3 and R4 are disposed on the output line 532. A node 505 between the resistors R3 and R4 is connected to a reference (REF) input of a voltage regulator 522. In various embodiments, the voltage regulator 522 is an adjustable shunt regulator including an op-amp having a lower input coupled to a precise internal reference voltage (e.g., 2.5 V) and an upper input connected to the REF input.

The output line 532 is also connected to a first voltage input of the comparison circuit 409 via an input (IN+) of the second op-amp 526. A baseline supply voltage is connected to a second voltage input of the comparison circuit 409 via an input (IN) to the low dropout voltage regulator 524. Together, the low dropout voltage regulator 524 and secondary op-amp 526 within the comparison circuit 409 function similar to a comparator but advantageously occupy a smaller volume within the control circuit 202. In other embodiments, the low dropout voltage regulator 524 and secondary op-amp 526 may be replaced with a comparator or another component or combination of components capable of producing an output voltage proportional to a difference between two input voltages. A resistor R26 couples the output of the comparison circuit 409 to a base of a bi-polar junction transistor 527 (Q6). As such, when the control signal exceeds the baseline voltage by a predetermined amount, the current at the base of the bi-polar junction transistor 527 (Q6) causes a current at the collector of the bi-polar junction transistor 527 (Q6). In various embodiments, the current is provided via a relay to additional components of the control circuit 202 (e.g., a pressure fault LED, a low pressure switch, etc.) to trigger actions responsive to the control signal reaching maximal levels.

In the embodiment of the compressor control circuit 308 shown in FIG. 4A, the output from the second op-amp 526 is connected to the condenser fan 252 via terminal 536. Thus, the low dropout voltage regulator 524 and second op-amp 526 are used in the comparison circuit 409 to control the state of the condenser fan 252 depending on the state of the compressor 256. If the supply voltage provided to the variable speed motor 304 drops below its minimum operational voltage, a control signal will be provided by the low dropout voltage regulator 524 to turn off the condenser fan 252. In the example embodiment of the compressor control circuit 308 shown in FIG. 4A, the low dropout voltage regulator 524 and second op-amp 526 are configured to turn off the condenser fan 252 when the output line 532 voltage drops below 1.6V. In various embodiments, the specifications of the low dropout voltage regulator 524 in the comparison circuit 409 may be modified to meet different operational requirements.

As shown in FIG. 4A, the first part 502 of the control circuit 202 also includes a start-stop indicator circuit 280 configured to notify a user when the start-stop system is enabled. The indicator circuit 280 is configured to control a light emitting diode (LED) to notify the user of the operating status of the start-stop system. In other embodiments, the indicator circuit 280 may be configured to control another form of alerting or display system.

Figure 4B:
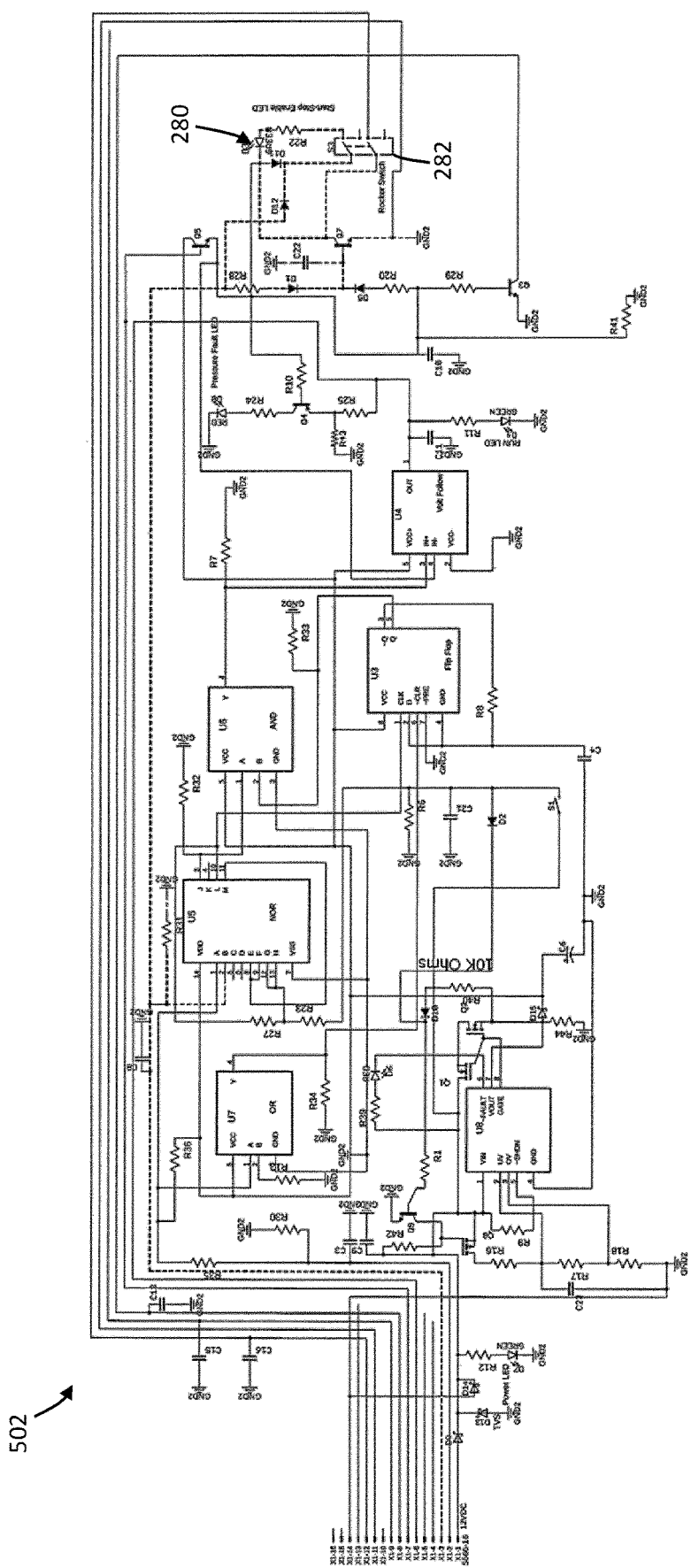
FIG. 4B is a schematic diagram of the first part of the control circuit of FIG. 4A.

FIG. 4B shows the first part 502 of the circuit control circuit 202 isolated from the second part 308 of the control circuit 202 of FIG. 4A. The start-stop indicator circuit 280 is identified by a dashed line. As shown in FIG. 4B, the indicator circuit 280 is configured to power the LED when the start-stop switch is enabled (e.g., when either the AC system is running or the start-stop system/truck is running and the AC system is deactivated). The indicator circuit 280 includes a plurality of rocker switches 282. When the start-stop system is energized, the indicator circuit 280 passes a 12V signal on to keep the LED powered even though the AC system is deactivated.

Figure 5:
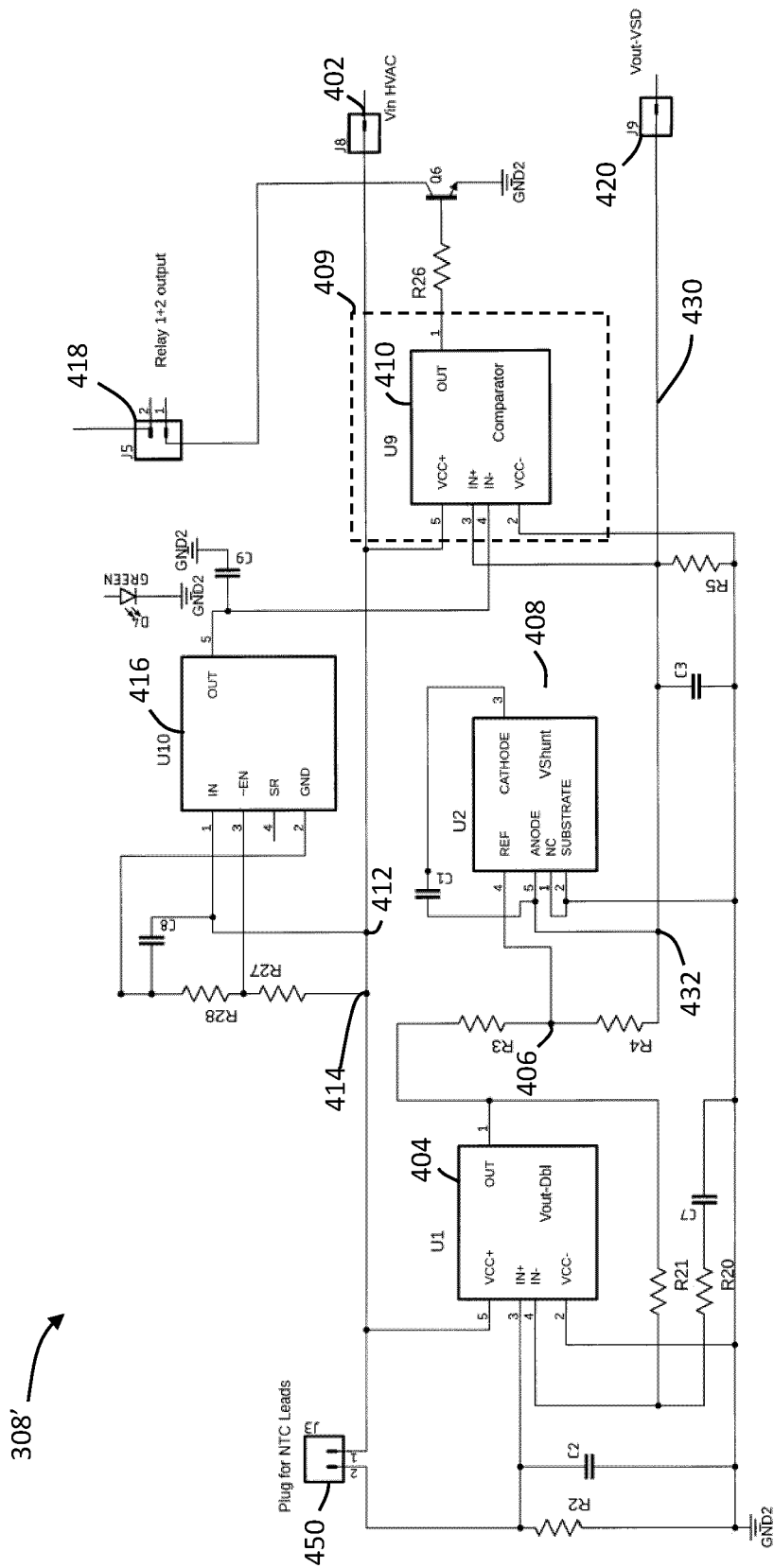
FIG. 5 is a schematic diagram of a compressor control circuit of the auxiliary AC system shown in FIG. 3, according to another example embodiment.

An alternative configuration of the compressor control circuit 308' is shown in FIG. 5, according to an example embodiment. In the embodiment shown in FIG. 5, the compressor control circuit 308' is isolated from the remainder of the control circuit 202 (not shown) by a separate power source. As shown, a supply voltage (e.g., from the auxiliary battery bank 112) is received via a connector jack 402. The supply voltage serves as a power supply to an op-amp 404 and a comparison circuit 409. The comparison circuit 409 includes a comparator 410. In additional embodiments, the comparison circuit 409 may include other electrical components. As shown, the supply voltage is also provided to a plug 450 to serve as an input to the temperature sensor 270 described with respect to FIG. 2. The temperature sensor 270 experiences a voltage drop proportional to an air temperature proximate thereto (e.g., at the evaporator return air grill). Thus, an output voltage from the temperature sensor 270 is dependent on the air temperature. The output voltage from the temperature sensor 270 is provided via the plug 450 to a positive input (IN+) of the op-amp 404. A resistor R2 and a capacitor C2 extend from nodes on a line connected to the positive input to account for rapid variations in the output voltage provided via the plug 450. A negative input (IN−) of the op-amp 404 is coupled to the output of the op-amp 404. The output of the op-amp 404 provides a varying output proportional to a difference between the output voltage from the plug 450 and a previous voltage (e.g., dependent on a previously measured voltage from the temperature sensor 270) output by the op-amp 404. Differences between successive voltages returned via the temperature sensor 270 therefore impact the magnitude of the output of the op-amp 404. In an example, if the temperature proximate to the temperature sensor 270 increases (e.g., leading to a decrease in resistance of the temperature sensor 270), the voltage delivered to the positive input of the op-amp 404 will increase over its previous value, potentially leading to an increase in the output of the op-amp 404 (e.g., if the voltage provided by the temperature sensor 270 increases to a great enough extent). Conversely, if the temperature proximate to the temperature sensor 270 decreases (e.g., leading to an increase in resistance of the temperature sensor 270), the voltage delivered to the positive input of the op-amp 404 will decrease below its previous value, thus leading to a decrease in the output of the op-amp 404.

As shown, an output line 430 extends from the output of the op-amp 404. In various embodiments, a control signal for the variable speed motor 304 of the compressor is provided via a connector jack 420 connected to the output line 430. The voltage (or other parameter) of the compressor speed signal is proportional to a temperature sensed by the temperature sensor 270. Thus, the control signal for the variable speed motor 304 increases or decreases depending on a change in temperature measured via the temperature sensor 270. In an embodiment, a potentiometer may be used to allow adjustment of a temperature setting of the temperature sensor 270, which would thereby shift the proportional range of the temperature sensor 270 relative to the control signal for the variable speed motor 304.

Two resistors R3 and R4 are disposed on the output line 430. A node 406 between the resistors R3 and R4 is connected to a reference (REF) input of a voltage regulator 408. In various embodiments, the voltage regulator 408 is an adjustable shunt regulator including an op-amp having a lower input coupled to a precise internal reference voltage (e.g., 2.5 V) and an upper input connected to the REF input. An output of the op-amp is coupled to a base of a transistor. An anode of the shunt regulator is connected to the emitter of the transistor and a cathode is connected to the collector. When the voltage at the REF input (e.g., at the node 406) exceeds the internal reference voltage, current flows between the cathode and the anode. As shown, a capacitor C1 is disposed between the cathode and the anode such that, when the voltage at the REF input exceeds the internal reference voltage, the capacitor C1 charges to regulate the current at a node 432 coupling the anode to the output line 430.

Values for resistances of the resistors R3 and R4 (in addition to a capacitance of a capacitor C3 and resistance of a resistor R5 connecting the output line 430 to ground) determine a threshold voltage that the output of the op-amp 404 must reach to cause conductance between the cathode and the anode of the voltage regulator 408. As such, when the output of the op-amp 404 is below the threshold voltage, the control signal proportionally tracks the output voltage of the op-amp 404. However, when the output of the op-amp 404 is above the threshold voltage, the control signal current is reduced in magnitude by the conductance between the cathode and anode of the voltage regulator 408. The voltage regulator 408 prevents large variations in the control signal when, for example, there are large variations in the output voltage of the temperature sensor 270.

The anode of the voltage regulator 408 is connected to ground via the capacitor C3 and resistor R5. A terminal of the resistor R5 is connected to a first input of the comparison circuit 409 via a positive input (IN+) to a comparator 410. As such, the voltage at the first input of the comparison circuit 409 is dependent on changes in the air temperature proximate to the temperature sensor 270. A second input of the comparison circuit 409 is connected to an output of a voltage regulator 416. The second input of the comparison circuit is a negative input to the comparator 410.

As shown, the supply voltage is also directed to inputs of the voltage regulator 416 via nodes 412 and 414. The node 412 is connected to a voltage (IN) input of the voltage regulator 416. The node 414 is connected to an active low enable (EN) input of the voltage regulator 416. A voltage divider constructed of resistors R27 and R28 determines a voltage at the EN input. A capacitor C8 determines a voltage at the IN input. In various embodiments, the voltage regulator 416 is a low-dropout regulator configured to maintain a constant voltage output despite variations in the power supply. The output voltage of the voltage regulator 416 is connected as the second input of the comparison circuit 409 via the negative input of the comparator 410 to serve as a consistent baseline reference with which to compare the control signal.

The comparison circuit 409 outputs a voltage proportional to a difference between the voltage at the terminal of the resistor R5 (e.g., the control signal) and the baseline voltage output by voltage regulator 416. In various embodiments, the comparison circuit 409 may include one component or a combination of components capable of producing an output voltage proportional to a difference between two input voltages (e.g. a standalone comparator, the combination of a low dropout voltage regulator and op-amp, etc.). The comparison circuit 409 shown in FIG. 5 includes a standalone comparator 410. A resistor R26 couples the output of the comparison circuit 409 to a base of a bi-polar junction transistor Q6. As such, when the control signal exceeds the baseline voltage by a predetermined amount, the current at the base of the bi-polar junction transistor Q6 causes a current at the collector of the bi-polar junction transistor Q6. In various embodiments, the current is provided via a relay 418 to additional components of the control circuit 202 (e.g., a pressure fault LED, a low pressure switch, etc.) to trigger actions responsive to the control signal reaching maximal levels.

It should be understood that alternative configurations of the control circuit 202 and the compressor control circuits 308 and 308' are envisioned. For example, the number of power supplies used in the control circuit 202 may be adjusted to improve reliability. The resistance and capacitance values for resistors and capacitors contained therein may be adjusted with respect to one another to maintain operation of the control circuit 202 and the compressor control circuits 308 and 308'. Furthermore, different components may be used in place of the op-amp 404, 518 and voltage regulators 408, 416, 522, and 524 without departing from the school of the present disclosure.

Referring now to FIG. 6, a flow diagram of a method 600 of controlling an auxiliary AC system for a vehicle is shown, according to an example embodiment. Method 600 may be performed via the compressor control circuit 308 or 308' described herein to generate a control signal for the variable speed motor 304 described herein. In the following description, reference will be made to compressor control circuit 308 (FIG. 4A). The flow diagram of method 600 may also be applied to other compressor control circuit 308' (FIG. 5) without departing from the school of the present disclosure.

In an operation 602, an output from a temperature measurement device is received. For example, in one embodiment, the temperature measurement device is the temperature sensor 270 and the output is a voltage bearing a relationship to an air temperature proximate to the temperature sensor 270. The temperature sensor 270 may be disposed at an air return grill covering an evaporator 302 of the auxiliary AC system 130. The output may be received by a first component (e.g., wire, connection jack, terminal, etc.) of the compressor control circuit 308.

In an operation 604, it is determined that the output indicates a change in a temperature in an environment of the auxiliary AC system 130. For example, via the op-amp 404 (or any other known form of comparator or difference amplifier), the compressor control circuit 308 may generate an output voltage proportional to a difference between the voltage provided via the temperature sensor 270 and a previous output of the op-amp 518. As such, the output voltage of the op-amp 518 may correspond to a difference between successive voltages provided via the temperature sensor 270. If the voltage provided via the temperature sensor 270 increases minimally or remains relatively constant, the output of the op-amp 518 may decrease. If, however, the voltage provided via the temperature sensor 270 increases by a predetermined amount (e.g., determined based on values of a resistor R2 coupling the output of the temperature sensor 270 to ground), the output of the op-amp 518 increases.

In an operation 606, a control signal is generated for the variable speed compressor 256 based on the change in temperature. For example, via the output line 532 of the compressor circuit 308, the output of the op-amp 518 may be modified and transmitted to the variable speed motor 304 as long as the output of the op-amp 532 remains below a threshold value (e.g., determined based on resistances of the resistors R3 and R4 disposed along the output line 532 and an internal reference voltage of the voltage regulator 522). If the output of the op-amp 518 reaches the threshold value, conductance between anodes and cathodes of the voltage regulator 522 may occur, causing the voltage regulator 522 to pull current from the output line 532 and reduce the control signal. Thus, the voltage regulator 522 effectively creates a ceiling for the control signal to protect against large increases in the output of the op-amp 518.

One or more flow diagrams may have been used herein. The use of flow diagrams is not meant to be limiting with respect to the order of operations performed. The herein described subject matter sometimes illustrates different components contained within, or connected with, different other components. It is to be understood that such depicted architectures are merely illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. An auxiliary air conditioning (AC) system for a vehicle comprising:
    an evaporator coil;
    a condenser coil coupled to the evaporator coil via a refrigerant conduit;
    a compressor disposed at the refrigerant conduit between the evaporator coil and the condenser coil, the compressor including a variable speed motor configured to pressurize refrigerant vapor received from the evaporator coil via the refrigerant conduit;
    a temperature measurement device configured to generate a variable output based on an air temperature in an environment proximate to the auxiliary air conditioning system; and
    a compressor control circuit communicably coupled to the variable speed motor, wherein the compressor control circuit is an analog control circuit configured to:
        receive the variable output from the temperature measurement device;
        determine that the output indicates a change in the air temperature; and
        generate a control signal for the variable speed motor, the control signal including a parameter having a magnitude depending on the extent of the change to vary a rate at which the compressor pressurizes the refrigerant vapor,
    wherein the temperature measurement device is a temperature sensor having a first terminal connected to a supply voltage and a second terminal coupled to the compressor control circuit, wherein the variable output is a voltage dependent on the air temperature, and wherein the compressor control circuit comprises:
        an operational amplifier including a positive input, a negative input, and a first output, wherein the positive input is connected to the second terminal and the negative input is coupled to the first output such that a first voltage at the first output is proportional to a difference between a parameter value of the variable output and a previous value of the first voltage;
        an output line connected to the first output, the output line including a first resistor and a second resistor and a node disposed between the first and second resistors, wherein the output line is connected to the compressor to provide the control signal thereto, wherein the control signal is generated based on the first voltage; and
        a first voltage regulator parallel to the output line, the first voltage regulator including a reference input connected to the output line via the node.

2. The auxiliary AC system of claim 1, wherein the compressor control circuit does not include a microprocessor.

3. The auxiliary AC system of claim 1, wherein the first voltage regulator is a shunt regulator.

4. The auxiliary AC system of claim 1, wherein the analog circuit further comprises a second voltage regulator including a voltage input and an enable input, wherein at least one of the voltage input or enable input are coupled to the supply voltage, the second voltage regulator including a second output configured to output a baseline voltage.

5. The auxiliary AC system of claim 4, wherein the analog circuit further comprises a comparison circuit including at least one component having a first voltage input and a second voltage input, wherein the first voltage input is connected to the output line and the second voltage input is connected to the second output such that the comparison circuit generates a comparison voltage at a third output that is proportional to a difference between the control signal and the baseline voltage.

6. The auxiliary AC system of claim 5, wherein the third output is connected to a base of a bi-polar junction transistor such that a collector of the bi-polar junction transistor emits a current when the control signal differs from the baseline voltage by more than a predetermined amount.

7. The auxiliary AC system of claim 1, further comprising an evaporator return grill receiving return air from the environment, wherein the temperature measurement device is disposed at the evaporator return grill.

8. A vehicle comprising:
a main battery bank;
an auxiliary battery bank; and
an auxiliary air conditioning (AC) system connected to the auxiliary battery to receive a supply voltage therefrom, wherein the auxiliary AC system includes:
an evaporator coil;
a compressor coupled to the evaporator coil via a refrigerant conduit, the compressor including a variable speed motor configured to pressurize refrigerant vapor received from the evaporator coil via the refrigerant conduit;
a temperature sensor connected to the auxiliary battery bank to receive the supply voltage via a first terminal thereof, the temperature sensor configured to generate a variable voltage at a second terminal thereof based on an air temperature; and
a compressor control circuit communicably coupled to the variable speed motor, the compressor control circuit configured to generate a control signal for the variable speed motor based on a difference between the air temperature and a previous air temperature measured via the temperature sensor,
wherein the compressor control circuit is an analog control circuit comprising:
an operational amplifier including a positive input, a negative input, and a first output, wherein the positive input is connected to the second terminal and the negative input is coupled to the first output such that a first voltage at the first output is proportional to a difference between a current value of the variable voltage and a previous value of the first voltage;
an output line connected to the first output, the output line including a first resistor and a second resistor and a node disposed between the first and second resistors, wherein the output line is connected to the compressor to provide the control signal thereto, wherein the control signal corresponds to the first voltage; and
a first voltage regulator parallel to the output line, the first voltage regulator including a reference input connected to the output line via the node, an anode, and a cathode, wherein the anode is connected to the cathode via a capacitor.

9. The vehicle of claim 8, further comprising a blower configured to generate a pressure differential between the auxiliary AC system and an interior area of the vehicle and a return air inlet configured to receive air from the interior area, wherein the temperature sensor is disposed at the return air inlet.

10. The vehicle of claim 9, further comprising an evaporator grill covering the return air inlet, wherein the temperature sensor is disposed on the evaporator grill.

11. The auxiliary AC system of claim 8, wherein the analog circuit further comprises a second voltage regulator including a voltage input and an enable input, wherein at least one of the voltage input or the enable input are coupled to the auxiliary battery to receive the supply voltage, the second voltage regulator including a second output configured to output a baseline voltage.

12. The auxiliary AC system of claim 11, wherein the analog circuit further comprises a comparison circuit including at least one component having a first voltage input and a second voltage input, wherein the first voltage input is connected to the output line and the second voltage input is connected to the second output such that the comparison circuit generates a comparison voltage at a third output that is proportional to a difference between a variable current voltage and the baseline voltage.

13. The auxiliary AC system of claim 12, wherein the third output is connected to a base of a bi-polar junction transistor such that a collector of the bi-polar junction transistor emits a current when the control signal differs from the baseline voltage by more than a predetermined amount.

14. An analog control circuit for an auxiliary air conditioning system, comprising:
a temperature sensor including a first terminal connected to a power supply and a second terminal connected to an input line;
an operational amplifier including a first input coupled to the input line and a second input coupled to a first output of the operational amplifier, wherein the first output is also coupled to an output line including a first resistor, a second resistor, and a node disposed between the first and second resistors; and
a first voltage regulator parallel to the output line, the first voltage regulator including a reference input connected to the output line via the node, wherein the output line is connected to a variable speed motor of a compressor of the auxiliary AC system such that the motor operates at a speed based on a voltage at the first output.

15. The analog control circuit of claim 14, further comprising:
a second voltage regulator including a voltage input and an enable input, wherein at least one of the voltage input or enable input are coupled to the power supply, the second voltage regulator including a second output configured to output a baseline voltage; and
a comparison circuit including at least one component having a first voltage input and a second voltage input, wherein the first voltage input is connected to the output line and the second voltage input is connected to the second output such that the comparison circuit generates a comparison voltage at a third output that is proportional to a difference between the baseline voltage and a control voltage, wherein the third output is connected to a base of a bi-polar junction transistor such that a collector of the bi-polar junction transistor emits a signal when the comparison voltage is a predetermined value.

* * * * *